(12) United States Patent
Yajima

(10) Patent No.: US 7,708,880 B2
(45) Date of Patent: *May 4, 2010

(54) CHEMICAL LIQUID SUPPLY APPARATUS AND A CHEMICAL LIQUID SUPPLY METHOD

(75) Inventor: Takeo Yajima, Tokyo (JP)

(73) Assignee: Koganel Corporation, Tokyo (JP)

( * ) Notice: Subject to any disclaimer, the term of this patent is extended or adjusted under 35 U.S.C. 154(b) by 303 days.

This patent is subject to a terminal disclaimer.

(21) Appl. No.: 10/477,933

(22) PCT Filed: Dec. 6, 2002

(86) PCT No.: PCT/JP02/12823

§ 371 (c)(1),
(2), (4) Date: Nov. 14, 2003

(87) PCT Pub. No.: WO03/057343

PCT Pub. Date: Jul. 17, 2003

(65) Prior Publication Data

US 2004/0144736 A1    Jul. 29, 2004

(30) Foreign Application Priority Data

Dec. 28, 2001   (JP)   .............................. 2001-401216

(51) Int. Cl.
*B01D 35/01*   (2006.01)
(52) U.S. Cl. .............................. 210/167.01; 210/167.3; 210/172.1; 210/188; 210/196; 210/206; 210/218; 210/416.1; 95/241

(58) Field of Classification Search .................. 210/188
See application file for complete search history.

(56) References Cited

U.S. PATENT DOCUMENTS 3,713,274 A * 1/1973 Sauer et al. .................... 96/157

(Continued)

FOREIGN PATENT DOCUMENTS

EP    1195524 A2 *  4/2002

(Continued)

OTHER PUBLICATIONS

Office Action dated Feb. 23, 2007 from corresponding U.S. Appl. No. 10/500,121 filed on Jun. 25, 2004.

(Continued)

*Primary Examiner*—Robert James Popovics
*Assistant Examiner*—T. Woodruff
(74) *Attorney, Agent, or Firm*—McCormick, Paulding & Huber LLP

(57) ABSTRACT

A buffer tank section (6) includes a liquid accumulation chamber (61) communicating with, through a liquid introduction flow path (42), a liquid tank (46) accumulation chemical liquid. A filter section (4) includes a filter inlet (41*a*) and a filter outlet (41*b*), wherein the filter inlet (41*a*) communicates with a liquid discharge vent (60*d*) of the buffer tank section (6). In a pump (11), a pump inlet (11*a*) is connected to the filter outlet (41*b*) and a pump outlet (11*b*) is connected to a discharge nozzle (50) through a liquid discharge flow path (47). A return flow path (48) is connected between the pump outlet (11*b*) and the buffer tank section (6), wherein the chemical liquid, discharged from the pump (11), is returned to the liquid accumulation chamber (61). An exhaust flow path (49) is connected to the buffer tank section (6), thereby exhausting air in the liquid accumulation chamber (61).

2 Claims, 3 Drawing Sheets

U.S. PATENT DOCUMENTS

| | | | | |
|---|---|---|---|---|
| 3,777,888 A * | 12/1973 | Zellbeck et al. | | 210/130 |
| 3,910,462 A * | 10/1975 | Abeles et al. | | 222/135 |
| 3,926,664 A * | 12/1975 | Verreydt | | 134/21 |
| 4,236,881 A * | 12/1980 | Pfleger | | 417/502 |
| 4,321,014 A * | 3/1982 | Eburn et al. | | 417/5 |
| 4,475,666 A * | 10/1984 | Bilbrey et al. | | 222/14 |
| 4,523,903 A * | 6/1985 | Arens | | 417/489 |
| 4,582,598 A * | 4/1986 | Bilstad et al. | | 210/101 |
| 4,601,409 A * | 7/1986 | DiRegolo | | 222/1 |
| 4,618,425 A * | 10/1986 | Yates | | 210/416.1 |
| 4,624,625 A * | 11/1986 | Schrenker | | 417/20 |
| 4,627,235 A * | 12/1986 | Kindermann et al. | | 60/415 |
| 4,660,741 A * | 4/1987 | Kirschner et al. | | 222/1 |
| 4,676,905 A * | 6/1987 | Nagao et al. | | 210/646 |
| 4,749,476 A * | 6/1988 | Storkebaum et al. | | 210/97 |
| 4,865,525 A * | 9/1989 | Kern | | 417/307 |
| 4,915,597 A * | 4/1990 | Moore | | 417/313 |
| 4,935,151 A * | 6/1990 | Do | | 210/739 |
| 4,950,134 A * | 8/1990 | Bailey et al. | | 417/383 |
| 4,955,992 A * | 9/1990 | Goodale et al. | | 96/197 |
| 5,061,156 A * | 10/1991 | Kuehne et al. | | 417/412 |
| 5,096,602 A * | 3/1992 | Yamauchi et al. | | 210/767 |
| 5,167,837 A * | 12/1992 | Snodgrass et al. | | 210/767 |
| 5,262,068 A * | 11/1993 | Bowers et al. | | 210/767 |
| 5,293,893 A * | 3/1994 | O'Dougherty | | 137/113 |
| 5,316,181 A * | 5/1994 | Burch | | 222/61 |
| 5,344,044 A * | 9/1994 | Hayden et al. | | 222/1 |
| 5,383,574 A * | 1/1995 | Raphael | | 222/1 |
| 5,383,958 A * | 1/1995 | Battaglia | | 96/188 |
| 5,425,803 A * | 6/1995 | van Schravendijk et al. | | 95/46 |
| 5,490,611 A * | 2/1996 | Bernosky et al. | | 222/1 |
| 5,490,765 A * | 2/1996 | Bailey et al. | | 417/2 |
| 5,516,429 A * | 5/1996 | Snodgrass et al. | | 210/767 |
| 5,527,161 A * | 6/1996 | Bailey et al. | | 417/53 |
| 5,590,686 A * | 1/1997 | Prendergast | | 137/597 |
| 5,607,000 A * | 3/1997 | Cripe et al. | | 141/21 |
| 5,636,762 A * | 6/1997 | Juhola et al. | | 222/1 |
| 5,645,625 A * | 7/1997 | van Schravendijk et al. | | 95/46 |
| 5,658,615 A * | 8/1997 | Hasebe et al. | | 427/240 |
| 5,762,795 A * | 6/1998 | Bailey et al. | | 210/416.1 |
| 5,772,899 A * | 6/1998 | Snodgrass et al. | | 210/767 |
| 5,792,237 A * | 8/1998 | Hung et al. | | 95/24 |
| 5,858,466 A * | 1/1999 | Liu et al. | | 427/294 |
| 5,868,278 A * | 2/1999 | Chen | | 222/1 |
| 5,878,918 A * | 3/1999 | Liao et al. | | 222/189.06 |
| 5,900,045 A * | 5/1999 | Wang et al. | | 95/241 |
| 5,971,723 A * | 10/1999 | Bolt et al. | | 417/413.1 |
| 5,989,317 A * | 11/1999 | Huang et al. | | 95/241 |
| 6,012,607 A * | 1/2000 | Hsu et al. | | 222/52 |
| 6,021,921 A * | 2/2000 | Lan et al. | | 222/61 |
| 6,024,249 A * | 2/2000 | On | | 222/52 |
| 6,062,442 A * | 5/2000 | Yang et al. | | 222/571 |
| 6,098,843 A * | 8/2000 | Soberanis et al. | | 222/53 |
| 6,105,829 A * | 8/2000 | Snodgrass et al. | | 222/214 |
| 6,171,367 B1 * | 1/2001 | Peng et al. | | 95/46 |
| 6,190,565 B1 * | 2/2001 | Bailey et al. | | 210/744 |
| 6,193,783 B1 * | 2/2001 | Sakamoto et al. | | 95/26 |
| 6,238,576 B1 * | 5/2001 | Yajima | | 210/767 |
| 6,245,148 B1 * | 6/2001 | Liang et al. | | 118/683 |
| 6,251,293 B1 * | 6/2001 | Snodgrass et al. | | 210/767 |
| 6,269,975 B2 * | 8/2001 | Soberanis et al. | | 222/1 |
| 6,325,932 B1 * | 12/2001 | Gibson | | 210/416.1 |
| 6,332,924 B1 * | 12/2001 | Shim et al. | | 118/684 |
| 6,336,959 B1 * | 1/2002 | Kamo | | 95/241 |
| 6,338,361 B2 * | 1/2002 | Kao et al. | | 137/512 |
| 6,340,098 B2 * | 1/2002 | Soberanis et al. | | 222/56 |
| 6,378,907 B1 * | 4/2002 | Campbell et al. | | 285/26 |
| 6,431,258 B1 * | 8/2002 | Konishi et al. | | 165/46 |
| 6,432,300 B2 * | 8/2002 | Larkner et al. | | 210/87 |
| 6,500,242 B2 * | 12/2002 | Fu et al. | | 96/157 |
| 6,539,986 B2 * | 4/2003 | Yajima | | 141/2 |
| 6,554,579 B2 * | 4/2003 | Martin et al. | | 417/53 |
| 6,585,885 B2 * | 7/2003 | Larkner et al. | | 210/87 |
| 6,612,505 B2 * | 9/2003 | Shyu | | 239/11 |
| 6,635,183 B2 * | 10/2003 | Gibson | | 210/767 |
| 6,641,670 B2 * | 11/2003 | Tsujii et al. | | 118/610 |
| 6,675,987 B2 * | 1/2004 | Soberunie et al. | | 222/53 |
| 6,726,774 B2 * | 4/2004 | Tzeng et al. | | 118/688 |
| 6,733,250 B2 * | 5/2004 | Yajima | | 417/313 |
| 6,752,599 B2 * | 6/2004 | Park | | 417/46 |
| 6,783,803 B2 * | 8/2004 | Tsujii et al. | | 427/356 |
| 6,817,486 B2 * | 11/2004 | Yang | | 222/55 |
| 7,007,822 B2 * | 3/2006 | Forshey et al. | | 222/53 |
| 7,018,472 B2 * | 3/2006 | Yamauchi | | 118/300 |
| 7,078,355 B2 * | 7/2006 | Nguyen | | 438/780 |
| 7,237,581 B2 * | 7/2007 | Jang | | 141/286 |
| 2002/0041312 A1 * | 4/2002 | Yajima | | 347/85 |
| 2002/0131875 A1 * | 9/2002 | Yajima | | 417/313 |
| 2004/0144736 A1 * | 7/2004 | Yajima | | 210/805 |
| 2005/0175472 A1 * | 8/2005 | Udagawa | | 417/313 |
| 2005/0238504 A1 * | 10/2005 | Yajima | | 417/394 |
| 2008/0011781 A1 * | 1/2008 | Yajima | | 222/146.1 |

FOREIGN PATENT DOCUMENTS

| | | | |
|---|---|---|---|
| EP | 1240932 A2 * | 9/2002 | |
| JP | 62140423 A | 6/1987 | |
| JP | 63-110636 | 5/1988 | |
| JP | 02281727 A | 11/1990 | |
| JP | 4-18958 | 1/1992 | |
| JP | 5-9636 | 2/1993 | |
| JP | 05-103921 | 4/1993 | |
| JP | 09299862 A * | 11/1997 | |
| JP | 10061558 | 3/1998 | |
| JP | 11-047670 | 2/1999 | |
| JP | 11230048 A * | 8/1999 | |
| JP | 2000120530 A * | 4/2000 | |
| JP | 2002113406 A * | 4/2002 | |
| JP | 2002273113 A * | 9/2002 | |
| JP | 2003148353 A * | 5/2003 | |
| JP | 2003197513 A * | 7/2003 | |
| JP | 2005083337 A * | 3/2005 | |
| WO | WO 3057343 A1 * | 7/2003 | |

OTHER PUBLICATIONS

Japanese Office Action

* cited by examiner

CHEMICAL LIQUID SUPPLY APPARATUS AND A CHEMICAL LIQUID SUPPLY METHOD

CROSS REFERENCE TO PRIOR APPLICATIONS

Applicant hereby claims foreign priority under 35 U.S.C. § 119 from JAPANESE Patent Application No. 2001-401216 filed 28 Dec. 2001 and PCT International Application No. PCT/JP02/12823 filed 6 Dec. 2002 the disclosures of which are herein incorporated by reference.

TECHNICAL FIELD OF THE INVENTION

The present invention relates to a chemical liquid supply apparatus and a chemical liquid supply method, which discharge a predetermined amount of liquid such as a chemical liquid or the like, and which is preferably used to, for example, coat a photoresist liquid onto the surface of a semiconductor wafer.

BACKGROUND OF THE INVENTION

A chemical liquid, such as a photoresist liquid, spin on glass liquid, polyimide resin liquid, pure water, etching liquid, organic solvent, and the like, has been used in manufacturing processes in various technical fields such as techniques of manufacturing a liquid crystal board, a magnetic disk, a multi-layered wiring board, and the like, starting from a semiconductor wafer manufacturing technique. A chemical liquid supply apparatus has been used in coating such chemical liquid.

For example, in case of coating the photoresist liquid onto the surface of the semiconductor wafer, the predetermined amount of photoresist liquid is dropped onto the surface of the semiconductor wafer from the chemical liquid supply apparatus, after having rotated the semiconductor wafer in a horizontal plane.

If bubbles are mixed into the apparatus in discharging the chemical liquid such as a photoresist liquid, the bubbles absorb a pressure trying to push out the chemical liquid and thereby a discharge amount of chemical liquid becomes unstable and accuracy of the discharge is reduced. Due to this, a semiconductor integrated circuit to be formed onto the semiconductor wafer has been difficult to manufacture with high quality and good yield.

A filter is provided in such chemical liquid supply apparatus in order to capture the bubbles in the chemical liquid, and foreign matters such as bubbles or the like are removed by getting the chemical liquid passing through the filter to enhance an extent of cleanliness of the chemical liquid. The bubbles accumulated in a filter vessel has ordinarily been exhausted to the outside by opening a deaeration valve, which is provided in an exhaust flow path connected to an exhaust port of the filter.

However, since the bubbles gradually adhere to the surface of the filter and the clogging thereof occurs, the capability of capturing the bubbles is reduced gradually. Due to this, the filter cannot completely capture the bubbles in the chemical liquid, and the chemical liquid containing the bubbles is often discharged on the surface of the semiconductor wafer. Consequently, it has been difficult to improve the yield of manufacturing the semiconductor integrated circuit.

Thus, a conventional method, in which the bubbles are removed through the filter and exhausted from the filter, has its limitations. To solve the problems as described above, it is necessary, even at a place or places other than the filter in the supply apparatus, to properly remove the bubbles included in the chemical liquid and exhaust them outside the supply apparatus.

An object of the present invention is to make stable an amount of chemical liquid discharged from a chemical liquid supply apparatus and to improve the accuracy of the discharge.

Another object of the present invention is to manufacture the semiconductor integrated circuits with high quality and good yield.

SUMMARY OF THE INVENTION

A chemical liquid supply apparatus according to the present invention comprises: a buffer tank section having a liquid accumulation chamber communicating with, through a liquid introduction flow path, a liquid tank accommodating chemical liquid; a filter section having a filter inlet and a filter outlet so that said filter inlet communicates with a liquid discharge vent of said buffer tank section; a pump in which a pump inlet is connected to said filter outlet and a pump outlet is connected to a discharge nozzle in a liquid discharge flow path; a return flow path connected between said pump outlet and said buffer tank section and returning, to said liquid accumulation chamber, the chemical liquid discharged from said pump; and an exhaust flow path connected to said buffer tank section and exhausting air in said liquid accumulation chamber.

The chemical liquid supply apparatus according to the present invention may further comprise an exhaust flow path connected to said filter section and exhausting gas in said filter section.

A chemical liquid supply method according to the present invention, which uses a chemical liquid supply apparatus including: a liquid accumulation chamber communicating with, through a liquid introduction flow path, a liquid tank accommodating chemical liquid; a filter having a filter outlet and a filter inlet communication with a liquid discharge vent of said liquid accumulation chamber; a pump having a pump inlet communicating with said filter outlet, and a pump outlet communicating with a discharge nozzle through a liquid discharge flow path; a discharge valve provided in said liquid discharge flow path and controlling an opening/closing operation of communication between said pump outlet and said discharge nozzle; and a return flow path connected between said pump outlet and said liquid accumulation chamber and returning, to said liquid accumulation chamber, the chemical liquid discharged from said pump, comprises: a sucking-step of sucking the chemical liquid filtered through the filter from said liquid accumulation chamber by operating said pump; a feedback step of closing said discharge valve to clean the chemical liquid and of returning the chemical liquid to said liquid accumulation chamber through said return flow path by performing a discharging operation of said pump; and a discharging step of opening said discharge valve in supplying the chemical liquid and of discharging the chemical liquid through said liquid discharge flow path by performing a discharging operation of said pump, wherein the chemical liquid, of which circulative filtration has been performed, is discharged from said discharge nozzle by shifting between a opening/closing operation of said discharge valve.

A chemical liquid supply method according to the present invention, which uses a chemical liquid supply apparatus including: a liquid accumulation chamber communicating with, through a liquid introduction flow path, a liquid tank accommodating chemical liquid; a pump having a pump inlet communicating with a liquid discharge vent of said liquid accumulation chamber, and a pump outlet communicating with a discharge nozzle through a liquid discharge flow path; a discharge valve provided in said liquid discharge flow path and controlling an opening/closing operation of communication between said pump outlet and said discharge nozzle; a return flow path connected between said pump outlet and said liquid accumulation chamber and returning, to said liquid accumulation chamber, the chemical liquid discharged from said pump; and an exhaust flow path communicating with said liquid accumulation chamber and exhausting air in said liquid accumulation chamber, comprises: a step of sucking the chemical liquid from said liquid accumulation chamber by operating said pump; an exhausting step of closing said discharge valve to clean the chemical liquid, of returning the chemical liquid to said liquid accumulation chamber through said return flow path by performing a discharging operation of said pump, and of exhausting, through said exhaust flow path, air accumulated in said liquid accumulation chamber; and a discharging step of opening said discharge valve in supplying the chemical liquid, and of discharging the chemical liquid from said discharge nozzle through said liquid discharge flow path by performing the discharging operation of said pump, wherein the chemical liquid, of which feedback exchange has been performed, is discharged from said discharge nozzle by shifting between an opening/closing operation of said discharge valve.

DESCRIPTION OF THE PREFERRED EMBODIMENTS

In the following, an embodiment of the present invention will be in detail explained based on the drawings.

Figure 1:
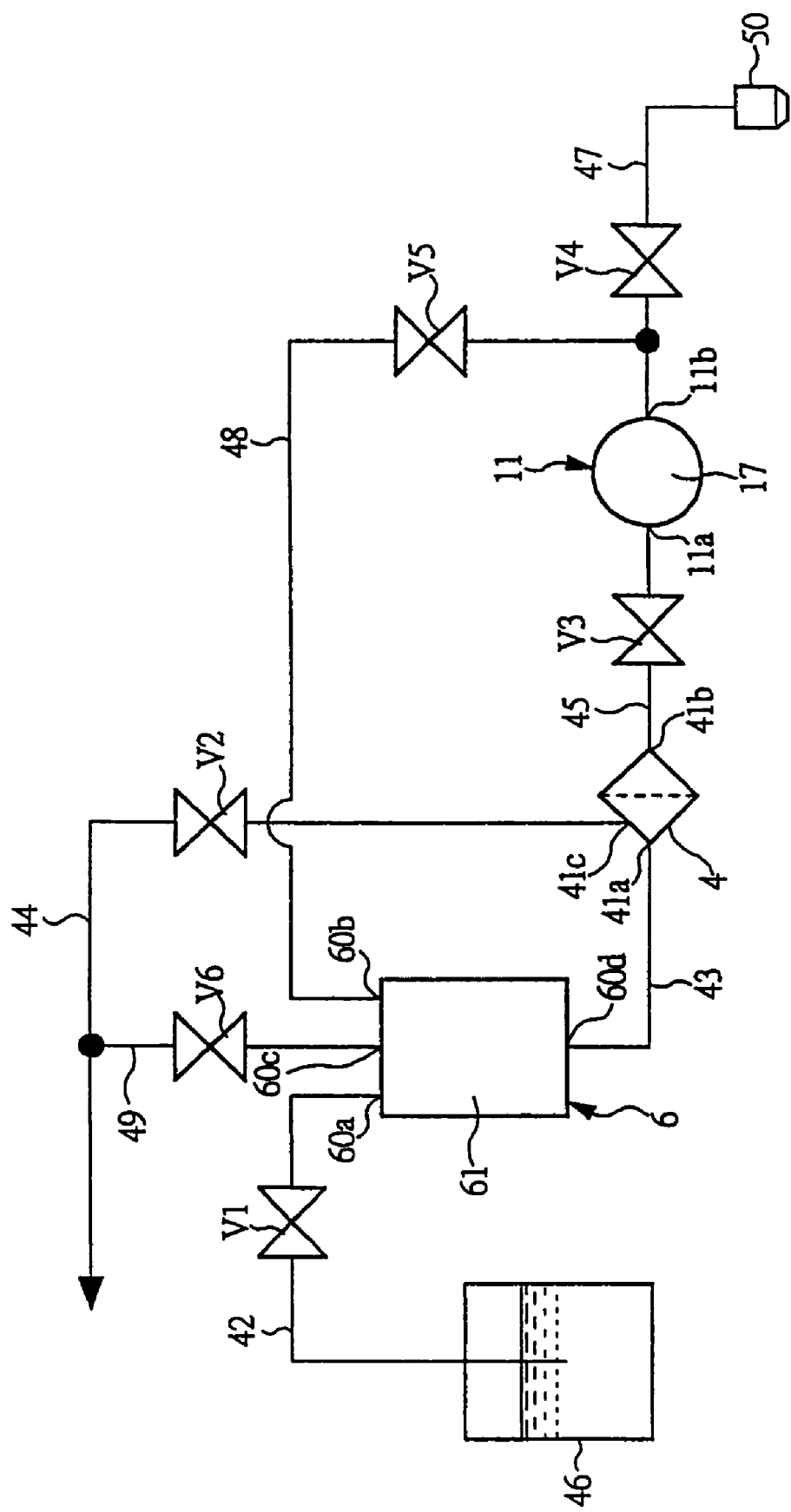
FIG. 1 is a liquid circuit diagram schematically showing a chemical liquid supply apparatus that is an embodiment of the present invention.

FIG. 1 is a liquid circuit diagram schematically showing a chemical liquid supply apparatus that is an embodiment of the present invention. As shown in FIG. 1, a buffer tank section 6 of the chemical liquid supply apparatus is inside provided with a liquid accumulation chamber 61. On a ceiling wall of the buffer tank section, there are formed: a liquid inpour port 60a to which a liquid introduction flow path 42 is connected; a liquid inpour port 60b to which a return flow path 48 is connected; and an exhaust port 60c to which an exhaust flow path 49 is connected. On a bottom wall of it, there is formed a liquid discharge vent 60d to which a communication path 43 is connected.

To the liquid inpour port 60a of the buffer tank section 6, one end of the liquid introduction flow path 42, provided with an introduction valve V1 for opening/closing the flow path, is connected. The other end of the liquid introduction flow path 42 is disposed to be located inside a liquid tank 46. Therefore, the buffer tank section 6 and the liquid tank 46 communicate with each other via the liquid introduction flow path 42.

A filter section 4 comprises a filter housing 40 and a filter 41 housed therein, and thereby the bubbles in liquid are captured on the surface of the filter 41 by passing the filter.

The filter housing 40 has a filter inlet 41a and a filter outlet 41b. One end of the communication path 43 is connected to the liquid discharge vent 60d of the buffer tank section 6; and the other end of the communication path 43 is connected to the filter inlet 41a of the filter housing 40. Accordingly, the filter housing 40 and the buffer tank section 6 communicate with each other via the communication path 43. Further, the filter 41 has an exhaust port 41c, and an exhaust flow path 44, which is provided with a deaeration valve V2 for opening/closing the flow path, is connected to the exhaust port 41c. Therefore, air, captured by the filter 41 and accumulating in the filter housing 40, can be exhausted from the exhaust port 41c to the outside of the filter 41.

One end of a pump inlet-side flow path 45, provided with a pump inlet-side valve V3 for opening/closing the flow path, is connected to a pump inlet 11a of a pump 11, and the other end of the pump inlet-side flow path 45 is connected to the filter outlet 41b of the filter 41.

The pump 11 sucks, from the pump inlet 11a to the inside of a pump chamber 17, the liquid passing the filter 41 when the pump chamber 17 is expanded, and discharges it from the pump outlet 11b when the pump chamber is contracted. Further, one end of a liquid discharge flow path 47, provided with a discharge valve V4 for opening/closing the flow path, is connected to the pump outlet 11b of the pump 11, thereby allowing the liquid discharged from the pump 11 to be guided to a discharge nozzle 50.

One end of the return flow path 48, provided with a return valve V5 for opening/closing the flow path, is connected between the pump outlet 11b and the discharge valve V4 of the liquid discharge flow path 47, and the other end of the return path 48 is connected to the liquid inpour port 60b of the buffer tank 6. Accordingly, the chemical liquid, discharged from the pump 11 to the liquid discharge flow path 47, is returned via the return flow path 48 into the liquid accumulation chamber 61 of the buffer tank section 6.

The exhaust flow path 49 is provided with a deaeration valve V6 for opening/closing this flow path. One end of the exhaust flow path is connected to the discharge port 60c of the buffer tank section 6, and thereby air in the liquid accumulation chamber 61 is exhausted from the discharge flow path 49. In the embodiment as shown in FIG. 1, the other end of the exhaust flow path 49 is connected to the exhaust flow path 44. However, instead of connecting the exhaust flow path 49 to the exhaust flow path 44, the embodiment may have a structure of being exhausted mutually and independently from both flow paths.

Figure 2:
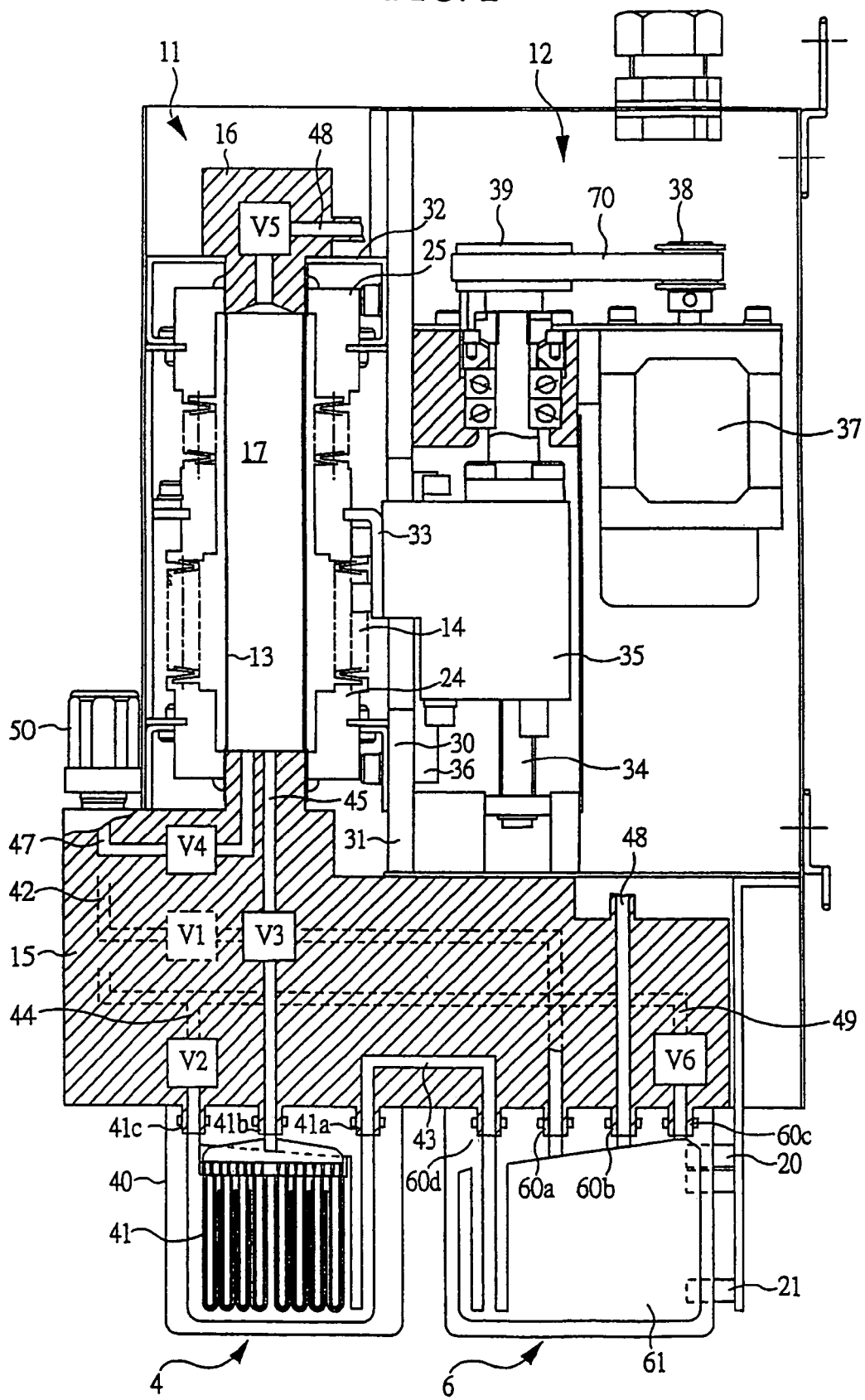
FIG. 2 is a cross-sectional view showing in detail the structure of a chemical liquid supply apparatus, which is constituted based on the liquid circuit diagram in FIG. 1.
Figure 3:
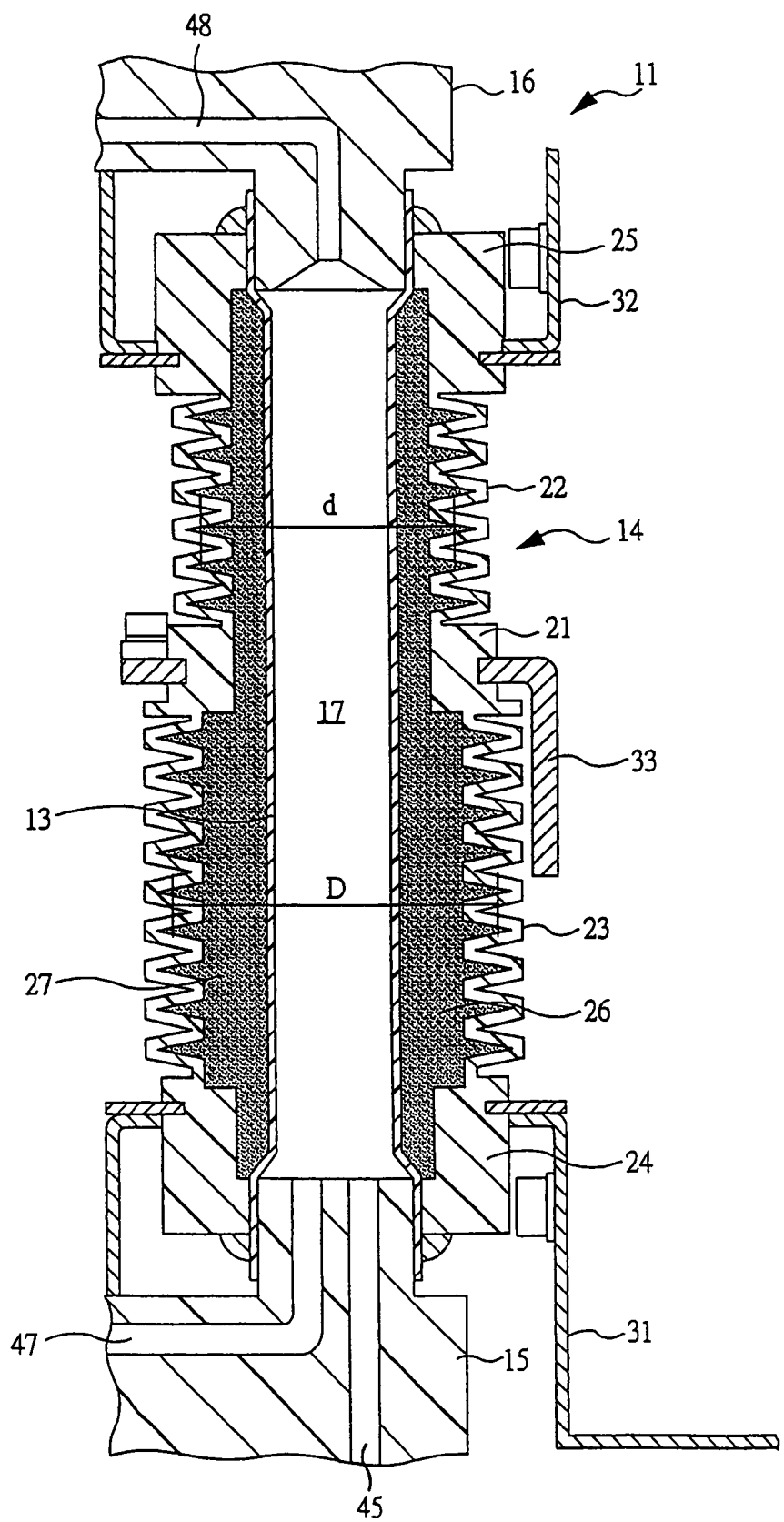
FIG. 3 is a cross-sectional view showing in detail a pump illustrated in FIG. 2.

FIG. 2 is a cross-sectional view showing in detail a structure of a chemical liquid supply apparatus constituted based on the liquid circuit diagram shown in FIG. 1, and FIG. 3 is a cross-sectional view showing in detail the pump illustrated in FIG. 2. As shown in FIGS. 2 and 3, the pump 11 comprises a flexible tube 13 made of an elastic material and being elastically retractable radially, and a bellows 14 disposed outside it and made of an elastic material and being elastically deformable axially.

The flexible tube 13 is disposed vertically. A first adaptor 15 is fixed to a lower end of the tube and a second adaptor 16 is fixed to an upper end thereof, whereby the inside of the flexible tube 13 disposed between the adaptors 15 and 16 operates as the retractable pump chamber 17.

The bellows 14 comprises, as shown in FIG. 3, an operating disk portion 21 disposed axially and at its center, a small bellows portion with an effective diameter of d, and a large bellows portion 23 with an effective diameter of D, which is larger than the effective diameter of d. Both bellows portions 22 and 23 are integrally formed through the operating disk portion 21. Fixed disks 24 and 25 are integrally provided at both ends of the bellows 14. The fixed disk 24 on a side of large bellows portion 23 is fixed to the first adaptor 15 through the flexible tube 13, and the fixed disk 25 on a side of the small bellows portion 22 is fixed to the second adaptor 16 through the flexible tube 13.

Since the chemical liquid to be supplied is a photoresist liquid, the flexible tube 13 is made of a resin material such as a tetrafluoroethyleneperfluoroalkylvinylether copolymer (PFA) or the like to be a fluorocarbon resin so as not to react with the chemical liquid. The adaptors 15 and 16 are also made of the same material. Further, the bellows 14 is also made of the same material, and the disk portions 21, 24 and 25 are integrally formed with the bellows portions 22 and 23. However, if being a material capable of elastic deformation, the resin material is not limited to the PFA and may be other resin materials for use. Further, the flexible tube 13 and the bellows 14 may be integrally formed. In this case, the adaptors 15 and 16 become unnecessary. Additionally, the bellows 14 may be made of metal.

The space between the flexible tube 13 and the bellows 14 disposed outside it serves as a drive chamber 26, and an incompressible medium 27 such as a liquid or the like is filled in the drive chamber 26. Therefore, the bellows 14 is elastically deformed axially by using the operating disk portion 21 disposed at its center, each volume inside the small bellows portion 22 and the large bellows portion 23 changes without changing the entire length of the bellows 14. As a result, the flexible tube 13 expands/contracts radially, i.e. transversely through the incompressible medium 27, so that the pump chamber 17 of the flexible tube 13 performs a pumping operation. The structure of the pump 11 shown in FIG. 3 is basically the same as the structure disclosed in the Japanese Patent Laid-open No. 10-61558 official gazette the present applicant has proposed. The flexible tube 13 may have, as disclosed in the above official gazette, various shapes such as an ellipse, a circle, a heteromorphy, or the like as a sectional shape.

The bellows 14 is fixed to a support base 30 by each of the fixed disks 24 and 25. The fixed disk 24 is fixed to the support base 30 through a fixed bracket 31 fitted in the fixed disk 24. The fixed disk 25 is fixed to the support base 30 through a fixed bracket 32 fitted in the fixed disk 25.

To perform the pumping operation by displacing axially the operating disk portion 21, an operating bracket 33, fitted in the operating disk portion 21, is linked to a ball nut 35, which is screw-coupled to a ball nut shaft 34 rotatably fixed to the support base 30 and extending parallel to the bellows 14. The ball nut 35 is slidably in contact with a guide rail 36 provided on the support base 30 such that it is axially driven by the rotation of ball screw shaft 34. To rotation-drive the ball screw shaft 34, a belt 70 is provided between a pulley 38, which is fixed to a shaft of a motor 37 attached to the support base 30, and a pulley 39 fixed to the ball nut shaft 34.

Since the respective flow paths are opened/closed by opening/closing the introduction valve V1 to deaeration valve V6 in accordance with the pumping operation of the pump 11, the chemical liquid supply apparatus can perform a chemical liquid discharging/supplying operation for coating the photoresist liquid. It should be noted that a solenoid valve operated by an electric signal, an air operation valve operated by an air pressure, or the like may be used as each of the introduction valve V1 to deaeration valve V6.

The filter section 4 and the buffer tank section 6 are detachably provided on a bottom surface of the first adaptor 15. The buffer tank section 6 is provided with a sensor 20 as a liquid detecting means and a sensor 21 as a lowest level detecting means, and both of the sensors are fixed to the bracket. The sensor 20 is disposed at the highest position that the level of the photoresist liquid, supplied to the inside of the liquid accumulation chamber 61, reaches while the sensor 21 is disposed at the lowest position that the level of the photoresist liquid, supplied to the inside of the liquid accumulation chamber 61, reaches. Therefore, the sensors 20 and 21 can detect the highest level and the lowest level of the photoresist liquid accommodated inside the liquid accumulation chamber 61.

In the embodiment, the sensors 20 and 21 are disposed at the highest position and the lowest position of the level of the photoresist liquid, respectively, but are not limited to these positions and may be provided at the intermediate position between the highest and lowest positions. Further, the sensors 20 and 21 perform the detections by optical transmission and cutoff, but are not limited to such detections and may each perform the detection by optical refraction index, a change in capacitance, a change in supersonic wave, or the like. Additionally, in the embodiment, the sensors 20 and 21 are provided outside the buffer tank section 6, but may be provided inside the buffer tank section 6 and may, in such case, employ a detecting means in which flotage is used.

As shown in FIGS. 2 and 3, the pump inlet-side flow path 45 and the liquid discharge-side flow path 47 are formed in the first adaptor 15 and the return flow path 48 is formed in the second adaptor 16. The bubbles, having flowed into the pump chamber 17 from the pump inlet-side flow path 45 along with the chemical liquid, has smaller specific gravity than the chemical liquid. Therefore, the bubbles gradually rise in the pump chamber 17 without flowing into the liquid discharge flow path 47 and move the return flow path 48.

In the embodiment shown in FIG. 2, these liquid introduction flow path 42, communication path 43, exhaust flow path 44, pump inlet-side flow path 45, liquid discharge flow path 47, return flow path 48, and discharge flow path 49 are formed in a block, which is made of the above-mentioned resin such as a PFA or the like and is integrally formed with the second adaptor 16 etc., but may each be formed using a hose pipe or the like.

A filter, used as the filter 41, is made of a hollow fiber membrane or a sheet-shaped membrane, but is not limited to such filter material if being capable of filtering the chemical liquid.

Next, a description will be made of an operation of the chemical liquid supply apparatus.

First, the liquid tank 46 and the liquid accumulation chamber are filled with the photoresist liquid, and an initial condition is set such that the sensors 20 and 21 detect the photoresist liquid. Under this condition, with the introduction valve V1 and the pump inlet-side valve V3 being opened and with the deaeration valves V2 and V6, the discharge valve V4, and the return valve V5 being closed, the pump 11 performs a sucking operation. By performing the sucking operation of the pump 11, the photoresist liquid, accommodated in the liquid tank 46, is supplied to the liquid accumulation chamber 61 via the liquid introduction flow path 42, then supplied to the filter section 4 via the liquid discharge flow path 43, thereafter filtered by the filter 41, and further sucked in the pump chamber 17 via the pump inlet flow path 45.

After completion of the sucking operation, with the discharge valve V4 being opened and with the pump inlet-side valve V3 and the return valve V5 being closed, the pump 11 performed a discharging operation. By the discharging operation of the pump 11, the photoresist liquid, accommodated inside the pump chamber 17, is discharged from the discharge nozzle 50 via the liquid discharge flow path 47 and is coated on the surface of the semiconductor wafer. By alternately performing such sucking operation and discharging operation, the chemical liquid supply apparatus can perform the chemical liquid discharging/supplying operation.

The chemical liquid supply apparatus can make circulative filtration of the chemical liquid in order to enhance an extent of cleanliness of the photoresist liquid. In the circulative filtration, a sucking operation, in which the photoresist liquid is sucked inside the pump chamber 11 with the introduction valve V1 and the pump inlet-side valve V3 being opened and with the deaeration valves V2 and V6, discharge valve V4, and the return valve V5 being closed, is performed, and thereafter a feedback operation, in which the introduction valve V1 is opened to make the pump 11 performing a discharging operation with the return valve V5 being opened and with the pump inlet-side valve V3 and the discharge valve V4 being closed. By performing this feedback operation, the photoresist liquid, sucked inside the pump chamber 17, is exhausted to the liquid discharge flow path 47 and then is returned to the liquid accumulation chamber 61 of the buffer tank section 6 via the return flow path 48. The liquid, returned to the buffer tank section 6, is a liquid having already passed the filter 41 and is deaerated by the filter 41, thereby having a high extent of cleanliness. Such liquid with the high extent of cleanliness passes the filter 41 again and is sucked by the pump 11, and so the photoresist liquid with the higher extent of cleanliness can be discharged/supplied.

Since the chemical liquid supply apparatus exteriorly exhausts the bubbles that the liquid accommodated in the liquid tank 46 contains, it can perform an exhausting operation. In the discharge operation, the photoresist liquid is returned into the liquid accumulation chamber 61 by the feedback operation in the circulative filtration and, thereafter, the sucking operation similar to the foregoing is performed again and the pump 11 is made to perform the discharge operation with the return valve V5 and the deaeration valve V6 being opened and with the introduction valve V1, the pump inlet-side valve V3, and the discharge valve V4 being closed. By performing this operation, air accumulated in the liquid accumulation chamber 61 can be exhausted from the exhaust flow path 49. Accordingly, the bubbles, which remain in the liquid without being completely removed even if passing the filter 41, are exhausted exteriorly from the exhaust flow path 49 communicating with the liquid accumulation chamber 61 of the buffer tank section 6, by performing the circulative filtration and the discharging operation.

When the chemical liquid supply apparatus is provided with another new liquid tank 46, the above-mentioned feedback filtration and exhausting operation are repeated predetermined times, thereby allowing the condition of performing a liquid coating operation to be prepared.

Needless to say, the present invention is not limited to the above-mentioned embodiment and can be variously altered and modified without departing from the gist thereof. For example, in the above description, the description has been made of the case of using the chemical liquid supply apparatus to coat the photoresist liquid on the semiconductor wafer. The present invention is not limited to the use of the resist liquid and can be applied to supply various kinds of liquid. Particularly, the present invention can be effectively used in the case where liquid, in which bubbles are easily produced, is made to pass the filter 41 and is discharged. Additionally, the pump 11 may be a diaphragm type as the form of a pump if being a variable volume type.

INDUSTRIAL APPLICABILITY

As described above, the chemical liquid supply apparatus and the chemical liquid supply method, according to the present invention, preferably supply chemical liquid, such as photoresist liquid, spin on glass liquid, polyimide resin liquid, pure water, etching liquid, organic solvent, and the like, which demands an extent of cleanliness in the manufacturing processes in various technical fields such as techniques of manufacturing a liquid crystal board, a magnetic disk, a multi-layered wiring board, and the like, starting from a semiconductor wafer manufacturing technique.

The invention claimed is:

1. A chemical liquid supply apparatus comprising:
   a liquid tank accommodating chemical liquid;
   a closed buffer tank section having a ceiling wall and a bottom wall enclosing therebetween a liquid accumulation chamber, which is connected to said liquid tank through a liquid introduction flow path connected through said ceiling wall, a liquid discharge vent being connected to said liquid accumulation chamber through said bottom wall;
   a filter section having a filter inlet connected with said liquid discharge vent of said buffer tank section, and a filter outlet;
   a pump having a pump inlet connected to said filter outlet through a pump inlet-side flow path and a pump outlet connected to a liquid discharge flow path to which a discharge nozzle is connected, an expandable and contractible pump chamber being provided in said pump;
   a return flow path connected between said pump outlet and said buffer tank section for returning, to said liquid accumulation chamber, the chemical liquid discharged from said pump; and
   a valved exhaust flow path connected through said ceiling wall of said buffer tank section for exhausting air from said liquid accumulation chamber,
   wherein under conditions where said liquid introduction flow path, pump inlet-side flow path, and liquid discharge flow path are closed, and where said return flow path and said exhaust flow path are opened, gas contained in said liquid accumulation chamber is exhausted via said exhaust flow path by contracting said pump chamber and returning the chemical liquid to said liquid accumulation chamber through said return flow path.

2. The chemical liquid supply apparatus according to claim 1, further comprising an exhaust flow path connected to said filter section for exhausting gas contained in said filter section.

* * * * *